US006337808B1

(12) United States Patent
Forbes (10) Patent No.: US 6,337,808 B1
(45) Date of Patent: Jan. 8, 2002

(54) MEMORY CIRCUIT AND METHOD OF USING SAME

(75) Inventor: Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/385,045

(22) Filed: Aug. 30, 1999

(51) Int. Cl.[7] .............................................. G11C 16/06
(52) U.S. Cl. .............. 365/185.21; 365/205; 365/185.33
(58) Field of Search ........................... 365/185.21, 205, 365/185.33

(56) References Cited

U.S. PATENT DOCUMENTS

| | | | |
|---|---|---|---|
| 3,781,574 A | 12/1973 | White et al. ................. 307/304 |
| 4,287,441 A | 9/1981 | Smith .......................... 327/94 |
| 4,903,237 A | 2/1990 | Rao ............................ 365/185 |
| 5,034,633 A | 7/1991 | Stekelenburg ............... 307/352 |
| 5,736,886 A | 4/1998 | Mangelsdorf et al. ...... 327/310 |
| 5,740,104 A | 4/1998 | Forbes .................. 365/185.03 |
| 5,838,176 A | 11/1998 | Delbruck et al. ............. 327/95 |
| 5,844,431 A | 12/1998 | Chen ........................... 327/94 |
| 5,915,176 A | 6/1999 | Lim ............................ 438/257 |
| 5,962,844 A | * 10/1999 | Merrill et al. .............. 250/214 |
| 6,130,423 A | * 10/2000 | Brchemer et al. ....... 250/208.1 |
| 6,185,119 B1 | * 2/2001 | Haeberli et al. .............. 365/45 |
| 6,215,713 B1 | * 4/2001 | Austin ........................ 365/205 |

OTHER PUBLICATIONS

Yang et al.; "An Integrated 800x600 CMOS Imaging System", IEEE International Solid State Circuits Conference 1999; WA 17.3.
Forbes; "Flash Memory With Long Endurance"; 8 total pages.

* cited by examiner

Primary Examiner—Richard Elms
Assistant Examiner—Tuan T. Nguyen
(74) Attorney, Agent, or Firm—Dickstein Shapiro Morin & Oshinsky LLP (57) ABSTRACT

The present invention provides a flash memory circuit having enhanced endurance properties. In a preferred embodiment, a differential flash memory cell and differential correlated double sampling sense amplifier are provided wherein a reduced charge differential on the floating gates of the memory cell are made possible and detectable by using a highly sensitive sense amplifier. A differential flash memory cell operating in the sub-threshold region is connected to a differential correlated double sampling sense amplifier to allow for charge differentials of less than $1.5 \times 10^{-8}$ coulombs/cm$^2$ between the two floating gates of each memory cell. This reduction in required charge greatly increases the long-term reliability and endurance of the memory cell, resulting in flash memory circuits which are capable of being used for over $10^9$ cycles.

125 Claims, 7 Drawing Sheets

MEMORY CIRCUIT AND METHOD OF USING SAME

BACKGROUND OF THE INVENTION

1. Field of the Invention

This invention relates to semiconductor memory devices and, in particular, to flash memory devices having long endurance.

2. Description of the Related Art

Non-volatile memory, such as EPROM (Electrically Programmable Read Only Memory), EEPROM (Electrically Erasable Programmable Read Only Memory) and Flash memory, is commonly used for storing data within computer systems. Non-volatile memory cells contain electrically isolated gates commonly referred to as floating gates. Data is stored in the memory cell by placing a charge on a cell's floating gate. The charge is used to indicate the binary state of the cell, either zero or one, which is typically indicated by a high threshold voltage or a low threshold voltage, respectively. The charge on a floating gate may be increased or removed through operations called program and erase.

Flash memory is desirable for certain applications as it does not need a constant power supply to retain its data and offers fast access times, low power consumption, and relative immunity to severe shock or vibration. These qualities, in combination with compact size, has propelled flash memory into a variety of uses in portable devices such as scanners, digital cameras, cell phones, pagers, and printers. Flash memory is similar to EPROM and EEPROM with the primary exceptions that flash memory must be erased in blocks rather than single bytes. In addition the blocks can be electrically erased, whereas an EPROM must be exposed to ultra-violet light to erase.

Figure 7:
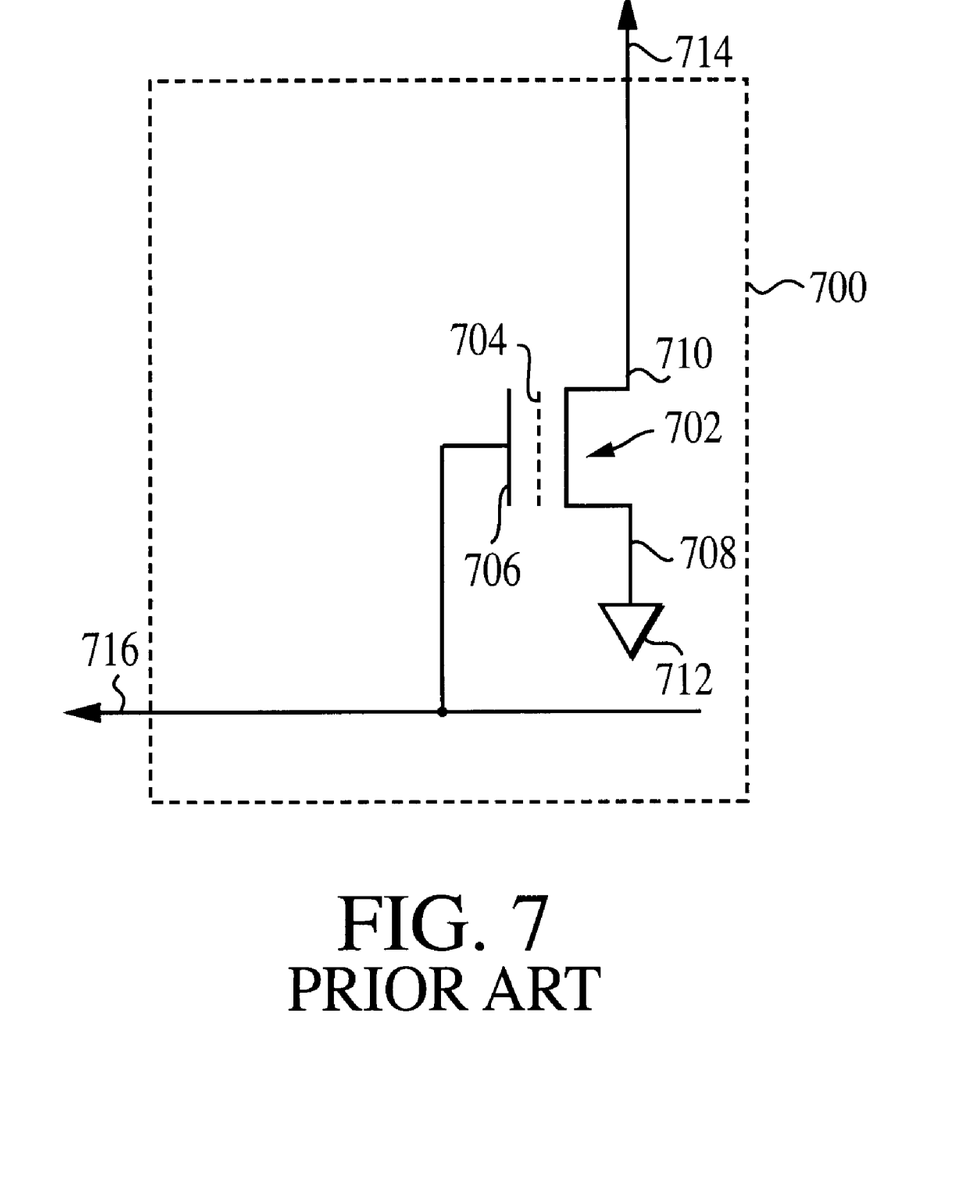
FIG. 7 is a circuit schematic of a prior art flash memory cell.

A typical flash memory cell 700 is shown in FIG. 7. Memory cell 700 includes transistor 702 with floating gate 704 and control gate 706. The floating gate 704 is electrically isolated in an insulative material, such as a gate oxide. Floating gate 704 may be a solid conductive material or may be constructed of a number of crystals of conductive material. Transistor 702 also includes source 708 and drain 710. Source 708 is coupled to ground potential 712 and drain 710 is coupled to bit line 714. Control gate 706 is coupled to word line 716.

Transistor 702 is programmed by grounding its source 708, applying a voltage to its control gate 706, and connecting its drain 710 to a programming voltage $V_{DD}$ that is high relative to the operating voltage Vcc. A typical value for $V_{DD}$ is 10 volts, while a typical value for Vcc is 5 volts. Once transistor 702 is biased by the application of $V_{DD}$, electrons tunnel through the insulative material to the floating gate 704, producing a net negative charge on the floating gate 704. This net negative charge shifts the threshold voltage (Vt) of the transistor 702 in the positive direction to a voltage that is greater than the normal operating voltage applied to the control gate 706.

Transistor 702 is erased by grounding control gate 706 and applying a relatively high voltage (e.g., 12 volts) to the source 708. This bias allows electrons to tunnel away from the floating gate 704 through the insulative material to be carried away by the large positive voltage on source 708. The loss of electrons on the floating gate 704 shifts the threshold voltage Vt of the transistor 702 in the negative direction to a voltage that is less than the normal operating voltage applied to the control gate 706.

After flash memory cell 700 is programmed or erased, the state of the storage transistor may then be "read" by determining whether the storage transistor conducts when the transistor is accessed. If the transistor 702 is programmed, i.e., there is a net negative charge on floating gate 704, transistor 702 will not conduct when accessed since the threshold voltage Vt is a voltage greater than the normal operating voltage applied to the control gate. If, on the other hand, the transistor 702 is erased, i.e., there is no charge on floating gate 704, transistor 704 will conduct when accessed since the threshold voltage Vt is less than the normal operating voltage applied to the control gate 706.

A sense amplifier coupled across the source 708 and bit line 714 of flash memory cell 700 may be used to determine whether transistor 702 conducts based upon the current that flows out of cell 700. A signal corresponding to the state of the cell 700, i.e., either a logic high or a logic low, is output by the sense amplifier.

However, there are significant problems with conventional flash memory cells as described above. On such problem is that flash memories have a limited endurance, the number of erase and/or program cycles over which the cell remains operative and reliable. This limitation precludes the use of flash memories in applications requiring longevity, e.g. disk drive replacement. Current flash memories have an endurance of $10^5$ to $10^7$ cycles as compared to $10^9$ cycles for a typical disk drive.

The basic physical phenomena or mechanism limiting the endurance of flash memories is fatigue or "wear-out" of the floating gate oxide. The total charge which can pass through a thin floating gate oxide is a measure of the endurance and is typically of the order of 10–15 coulombs/cm$^2$. For example, current flash memories typically use a floating gate oxide having a thickness of approximately 100 Angstroms which, when charged by the accumulation of electrons during a program operation, results in about a 3 V change in $V_t$. The capacitance of a 100 A gate oxide is about $3.2 \times 10^{-7}$ farads/cm$^2$. Therefore, to achieve a 3 V change in $V_t$ a charge of $1 \times 10^{-6}$ coulombs/cm$^2$ is required. If the typical endurance of the gate oxide is 10 coulombs/cm$^2$, the gate will allow $10^7$ operational cycles before becoming unreliable. As noted above, a memory device capable of being used for $10^7$ cycles is insufficient as replacement for most disk drive applications.

Thus there exists the need for a flash memory cell that provides reliable data storage while having an endurance of greater than $10^7$ cycles.

SUMMARY OF THE INVENTION

The present invention provides a flash memory circuit having enhanced endurance properties. In a preferred embodiment, a differential flash memory cell and differential correlated double sampling sense amplifier are provided wherein a reduced charge differential on the floating gates of the memory cell is made possible and detectable by using a highly sensitive sense amplifier. A differential flash memory cell operating in the sub-threshold region is connected to a differential correlated double sampling sense amplifier to allow for charge differentials of less than $1.5 \times 10^{-8}$ coulombs/cm$^2$ between the two floating gates of each memory cell. This reduction in required charge greatly increases the long-term reliability and endurance of the memory cell, resulting in flash memory circuits which are capable of being used for over $10^9$ cycles.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments arc described in sufficient detail to enable those skilled in the art to practice the invention, and it is to be understood that other embodiments may be utilized, and that structural, logical and electrical changes may be made without departing from the spirit and scope of the present invention. Wherever possible, like numerals are used to refer to like elements and functions between the different embodiments of the present invention.

Figure 1:
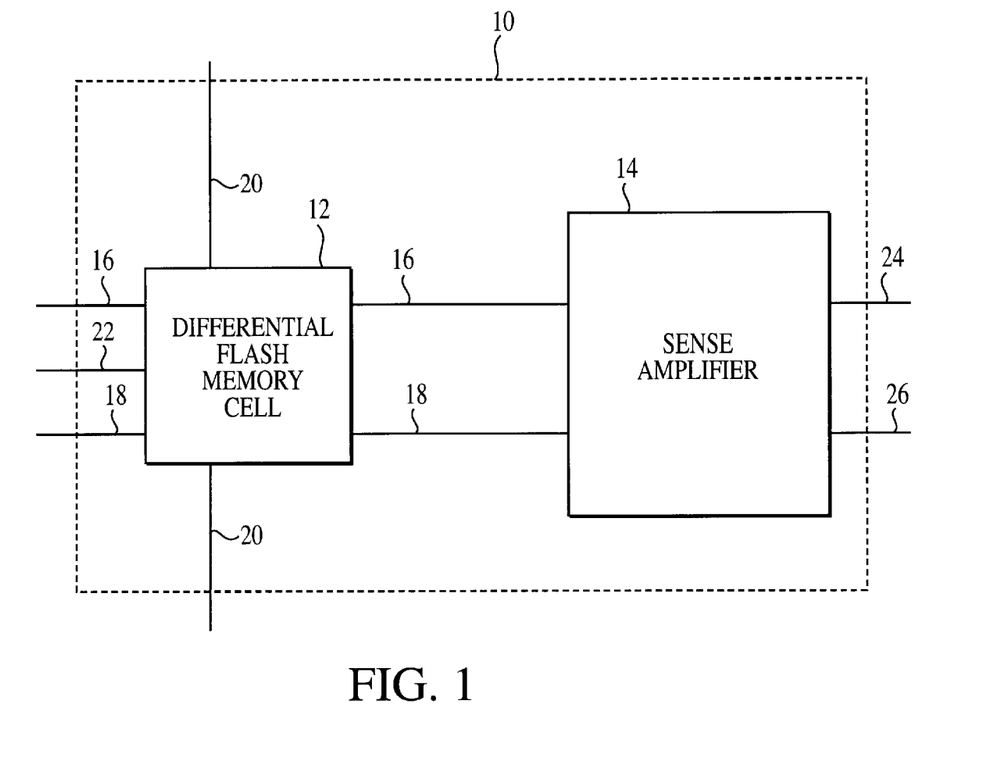
FIG. 1 is a block diagram of a memory circuit of the present invention.

FIG. 1 shows a preferred embodiment of an integrated circuit device 10 of the present invention which stores and senses data in a non-volatile environment. The circuit device 10 itself may be part of a larger integrated circuit which requires a memory device having superior endurance, e.g. flash memory chips for use as replacements for standard disk drives.

The circuit device 10 has at least one differential flash memory cell 12 connected to at least one differential correlated double sampling ("DCDS") sense amplifier 14 by data, or bit, lines 16 and 18. Flash memory cell 12 is further connected to word line 20 and source line 22. The output of DCDS sense amplifier 14 is transmitted on output lines 24 and 26.

Figure 2:
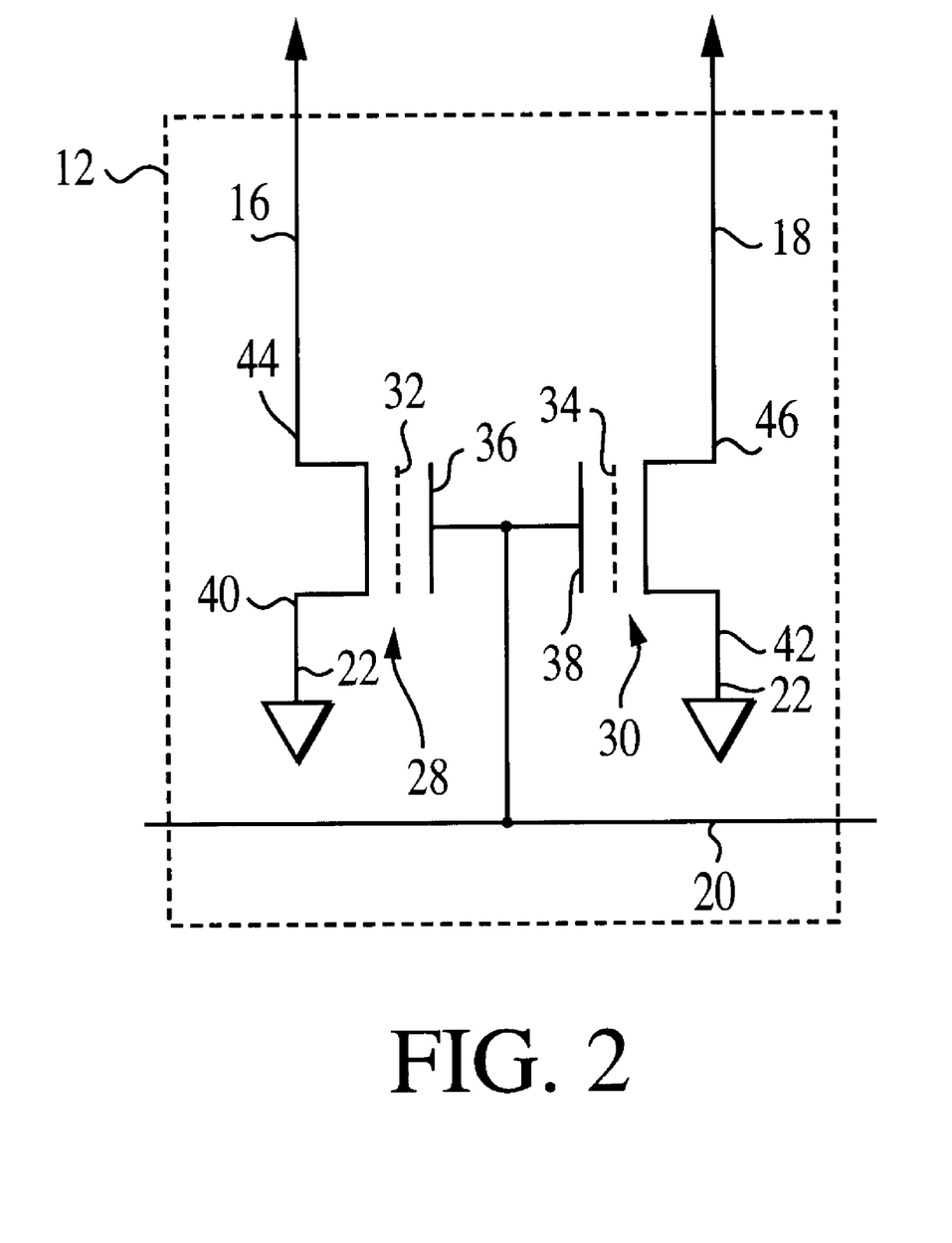
FIG. 2 is a schematic diagram of a memory cell shown in FIG. 1.

FIG. 2 is a schematic diagram of an illustrative embodiment of a differential flash memory cell 12 constructed according to the invention. Memory cell 12 includes first and second field-effect transistors 28 and 30. Transistors 28 and 30 include floating gates 32 and 34, respectively. Floating gate transistors 28, 30 have respective gates 32 and 34 which are electrically isolated in an insulative material, such as a gate oxide. The gates themselves may be any conductive material, preferably formed of poly-crystalline or nano-crystalline silicon. Cell 12 stores data based on the difference in charge on floating gates 32 and 34. Cell 12 is substantially non-volatile (e.g., when power is turned off to cell 12, data stored in floating gates 32 and 34 is not lost) due to a low refresh requirement necessary to maintain charge on floating gates 32 and 34. Further, transistors 28 and 30 include respective control gates 36 and 38. Control gates 36 and 38 are coupled together and are coupled to word line 20. Transistors 28 and 30 also include sources 40, 42 and drains 44, 46, respectively. Sources 40 and 42 are coupled to source line 22 and drains 44 and 46 are coupled to data lines 16 and 18, respectively.

In one embodiment, floating gates 32 and 34 are constructed of a number of isolated crystals of conductive material, e.g. nano-crystalline structures. Other structures for floating gates 32 and 34 may be substituted for this crystal structure so long as the structure allows charge stored on the floating gates to cause measurable changes in drain current of the transistors, as described below. This includes polycrystalline silicon gates as normally employed in flash memories. Other flash memory cells which may be used in the present invention include those described in U.S. Pat. No. 5,801,401 1 (L. Forbes), U.S. Pat. No. 5,852,306 (L. Forbes), U.S. Pat. No. 5,886,368 (L. Forbes, J. Geusic and K. Ahn), each incorporated herein by reference.

Correlated double sampling (CDS) is a method used most often in applications which require the sensing of relatively small voltages, e.g. CCD imaging systems. In CDS, the output of a sense amplifiers, e.g. DCDS sense amplifier 14, are sampled once after tie amplifier has been reset and placed in a sensitive state, and then sampled again after the memory cell 12 has been accessed and the DCDS sense amplifier 14 has settled. The sampling is "correlated" because it is synchronized with the reset/sense phases of the DCDS sense amplifier 14. The output of a differential CDS method is the difference between the two samples output on lines 24 and 26 which, in turn, represent the logic state of memory cell 12.

Figure 4:
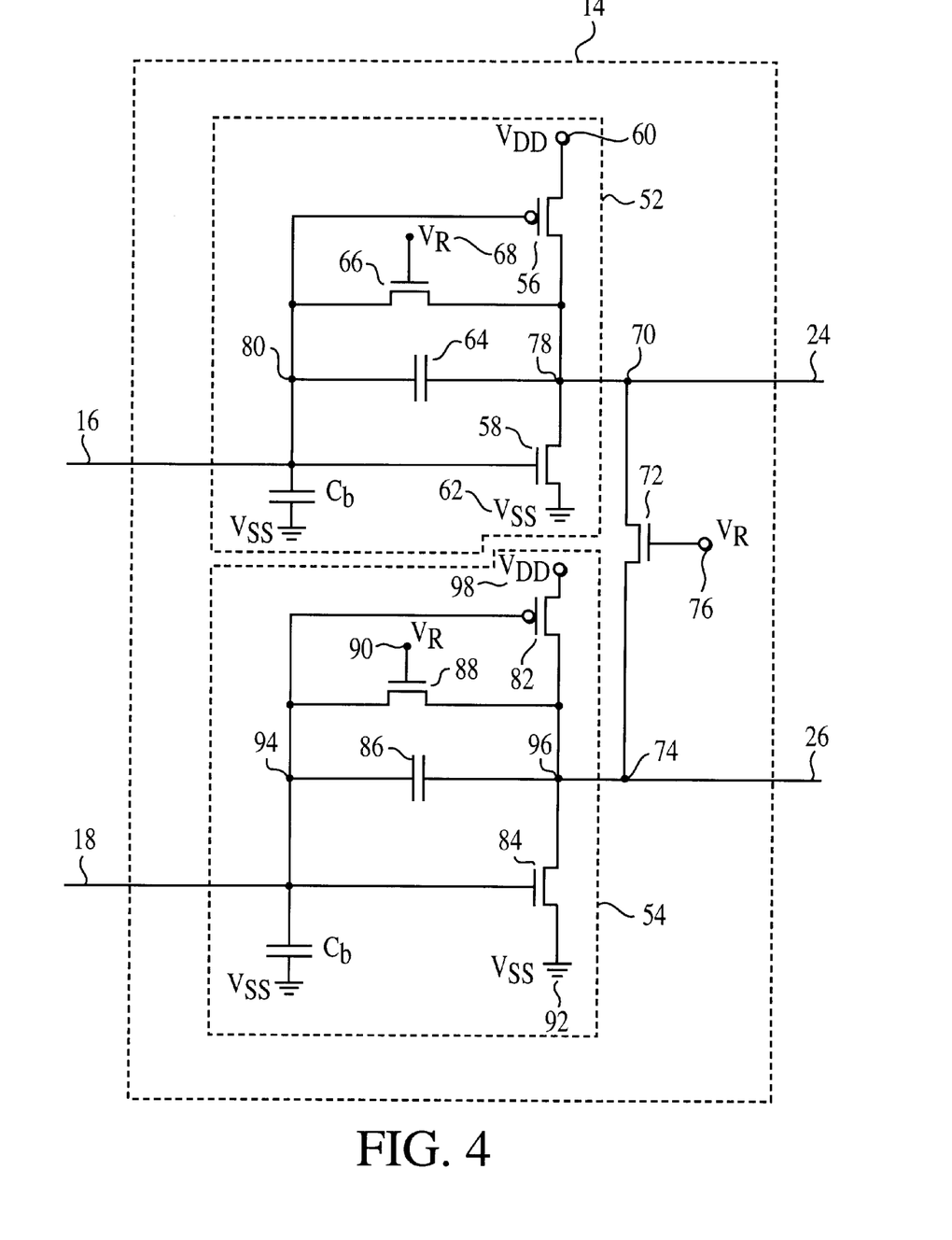
FIG. 4 is a schematic diagram of a sense amplifier circuit shown in FIG. 1.

DCDS sense amplifier 14, as shown in FIG. 4, has at least two CMOS sense amplifier circuits 52, 54 each receiving a data signal on data lines 16, 18 and outputting an output signal on lines 24, 26, respectively. The CMOS sense amplifier circuits 52, 54 are each connected to flash memory cell 12 by data lines 16 and 18, respectively, as shown in FIG. 1. Output lines 24, 26 are preferably connected to any number of integrated circuit elements known in the art, e.g. a bus or central processing unit.

Returning to FIG. 4, for the purposes of example sense amplifier 52 for the data signal on data line 16 is now described, though the sense amplifier 54 for the data signal on data line 18 is identical in structure and operation. P-channel transistor 56 and N-channel transistor 58 are connected in series through node 78. P-channel transistor 56 is connected to voltage supply ($V_{DD}$) 60. $V_{DD}$ 60 is preferably the internal voltage of the circuit device 10. N-channel transistor 58 is connected to ground ($V_{SS}$) 62. Line 16 is coupled to the gate of P-channel transistor 56 and N-channel transistor 58. Capacitive feedback for the sense amplifier 52 is supplied by capacitor 64 which has one plate connected to terminal 80 and the other plate to terminal 78. N-channel reset transistor 66 is connected between terminal 78 and terminal 80. The gate of N-channel transistor 66 is driven by reset voltage source $V_R$ 68. $V_R$ 68 is preferably the nominal data line voltage for the integrated circuit of which circuit 10 is a portion thereof.

Sense amplifier 54 is constructed similarly to sense amplifier 52 of FIG. 4. Sense amplifier 54 includes an N-channel transistor 84, P-channel transistor 82, N-channel reset transistor 88, capacitive feedback capacitor 86, terminals 94 and 96, voltage sources $V_R$ 90 and $V_{DD}$ 98, and ground $V_{SS}$ 92.

Terminal 70 of the sense amplifier 52 is coupled to output line 24 and N-channel reset transistor 72. Terminal 74 of sense amplifier 54 is similarly coupled to output line 26 and N-channel reset transistor 72. The gate of N-channel reset transistor 72 is driven by reset voltage source $V_R$ 76.

Though one particular type of DCDS sense amplifier 14 has been described herein, it should be understood that any DCDS sense amplifier known in the art may be substituted. In addition, the invention need not be limited to the specific components shown, any sense amplifier known in the art which may be integrated into a DCDS sense amplifier may also be substituted for sense amplifiers 52 or 54.

Figure 3:
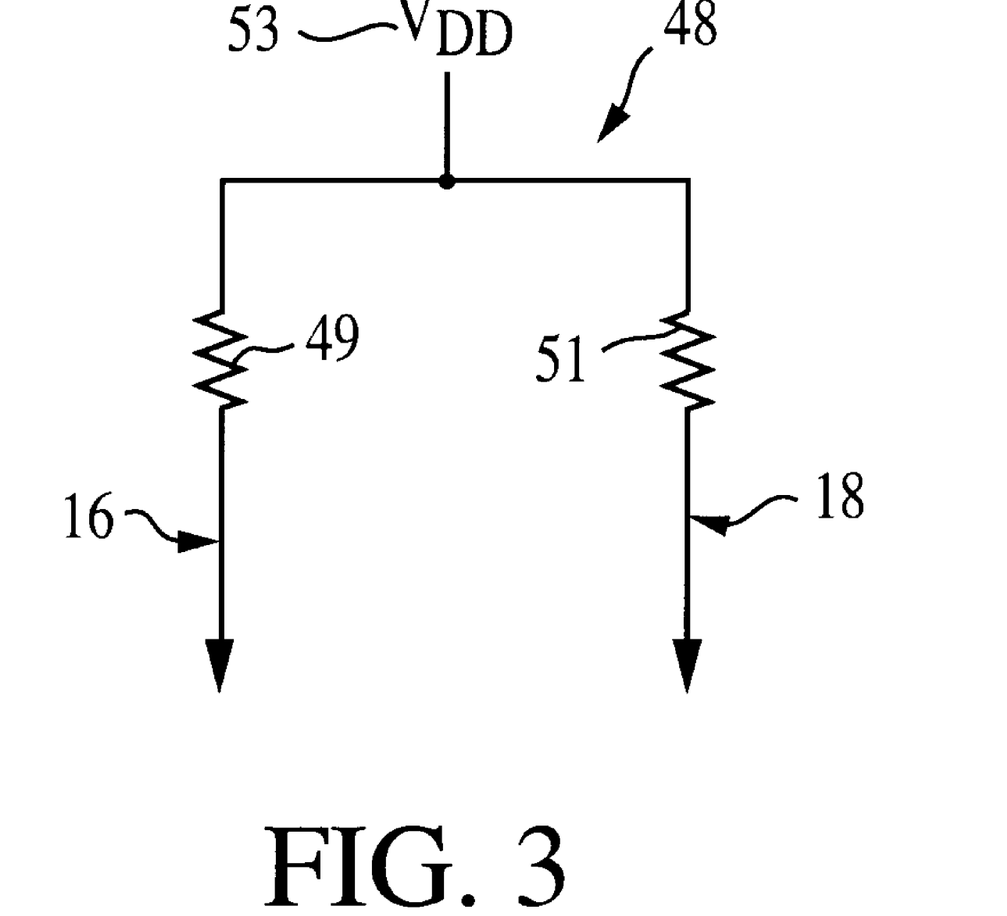
FIG. 3 is a schematic diagram of a portion of a memory cell shown in FIG. 1.

In operation, flash memory cell 12 stores data using floating gates 32 and 34 of transistors 28 and 30. To program data to cell 12, transistors 28 and 30 are first balanced or adjusted so that the transistors 28 and 30 have substantially the same conductivity state or drain current. Transistors 28 and 30 are balanced by adjusting the charge on floating gates 32 and 34. This may be accomplished by coupling data lines 16 and 18 to a mutual power supply through small resistors using, for example, a simple load circuit as shown in FIG. 3. Load circuit 48 includes first and second resistors 49 and 51 and power supply $V_{DD}$ 53, Resistor 49 is coupled between $V_{DD}$ 53 and data line 16. Similarly, resistor 51 is coupled between $V_{DD}$ 53 and data line 18.

The degree of balance between transistors 28 and 30 can be determined by connecting data lines 16 and 18 to differential sense amplifier 14 and monitoring the small voltage drop across transistors 28 and 30. The balance operation can be terminated when the conductivity of transistors 28 and 30 reach an acceptable balance level.

Once transistors 28 and 30 are balanced, memory cell 12 can be programmed by storing charge on floating gate 34 by, for example, using hot electron injection. A voltage, $V_P$, is applied to data line 18 and a lower voltage, preferably about 0.67 $V_P$, is applied to data line 16. This will induce hot electron injection onto gate 34 of transistor 30. Because the transistor 28 is operating near the linear region, it will experience insubstantial hot electron injection. Thus, a charge is built up on floating gate 34 of transistor 30 which reduces its conductive state. In this example, transistor 28 stores the initial or pre-programming state of transistor 30 due to the balancing operation. One transistor, in this example transistor 30, has been programmed with an extra electron charge injected on to the gate 34. Such a state may represent a logic state of 1 or 0, e.g. a logic "1". In another example neither transistor 28 or 30 may undergo hot electron injection or both may be programmed by hot electron injection such that the characteristics of both transistors 28, 30 match within acceptable limits. In such a case the memory cell 12 holds the opposite logic state, e.g. a logic "0". In either example, the difference between the state of transistor 28 and the state of programmed transistor 30 establishes the value of data stored in cell 12. Preferably, the extra charge experienced by either gate 32 or 34 is less than $1.5 \times 10^{-8}$ coulombs/cm$^2$. The transistor 30 has been subjected to additional programming, or charge, to increase the threshold voltage (Vt) of the gate 34. Thus, the device characteristics of transistor 28 are substantially unchanged while charge is built up on floating gate 34 of transistor 30 to reduces its conductive state. The change in conductivity of transistor 30 can be monitored during programming to store a value that represents a number of bits of data.

The increase in $V_t$ is preferably between about 50 mV to about 100 mV, which, when transistor 30 is accessed, results in a change in current output of approximately 1 $\mu$A. To obtain a change in $V_t$ of approximately 50 mV, the change in charge ($\Delta Q$) of the floating gate 34 versus floating gate 32 is preferably approximately $1.5 \times 10^{-8}$ coulombs/cm$^2$. If the gate oxide is, for example, 100 A thick and has a capacitance of $3.2 \times 10-7$ F/cm$^2$, the required change in Vt of gate 34 would require an extra charge on gate 34 of approximately $1.5 \times 10^{-8}$ coulombs/cm$^2$. On a 1 micron by 1 micron gate, for example, a charge of approximately $1.5 \times 10^{-8}$ coulombs/cm$^2$ would require injection of only about 1,000 electrons. By allowing such a small additional charge to be sensed, as compared to the 10,000 to 100,000 electrons normally required, the invention significantly increases the endurance of flash memory cell 12. Assuming that the endurance of the gate oxide is approximately 15 coulombs/cm$^2$, this would allow $10^9$ operations on the memory cell 12. $10^9$ operations is sufficient to allow use of flash memory cell 12 in non-traditional applications, e.g. disk drives.

In a read operation, data is read from cell 12 by amplifying the difference in charge stored on floating gates 32 and 34. This is accomplished by the use of DCDS sense amplifier 14. The differential configuration of DCDS sense amplifier 14 amplifies the differences in drain current of transistors 28 and 30 which is due to differences in charge stored on floating gates 32 and 34. The use of DCDS sense amplifier 14 allows the invention to sense the reduced variance in $V_t$ between gates 32 and 34.

DCDS sense amplifier 14 employs correlated double sampling to produce an output signal on lines 24 and 26. Prior to the data stored on cell 12 being transmitted to DCDS sense amplifier 14, voltages sources $V_R$ 68, $V_R$ 76 and $V_R$ 90 are activated. $V_R$ 68, 76, and 90 gate transistors 66, 72, and 88, respectively, to an "on" state. This is called a reset operation and it is used to bring lines 16, 18, 24, 26, and DCDS sense amplifier 14 to a reference level. The double sampling process begins at this point when a reading from DCDS sense amplifier 14 is taken prior to cell 12 being accessed. The creation of this reference level is to isolate electronic noise from the signal produced when the memory cell 12 is read.

Once the reference level has been established by turning transistors 66, 72, and 88 on for a predetermined amount of time, e.g. one nanosecond, the memory cell 12 may be accessed and the charges stored on gates 32 and 34 are output on data lines 16, and 18, respectively. When the data signal on data line 16 is high, P-channel transistor 56 is off and N-channel transistor 58 is on. Thus, terminal 78 is driven to ground $V_{ss}$. When the data signal on data line 16 is low, P-channel transistor 56 is on and N-channel transistor 58 is off; driving terminal 78 to $V_{DD}$. The current flowing through the capacitor $C_f$ 64 will be integrated by capacitor 64. The integration of the current will produce a voltage signal on terminal 78 which is proportional to the strength of the current and length of time it has been flowing and inversely proportional to the capacitance of capacitor 64. The voltage signal at terminal 78 is output on output line 24.

The operation of sense amplifier 54 is similar to the operation of sense amplifier 52 described above. A data signal on line 18 from memory cell 12 turns P channel transistor 82 and N channel transistor 84 on or off depending upon the state of the signal as described above. The data signal on line 18 has a lower current from the extra injection of electrons applied to gate 34 of memory cell 12. This causes the voltage at terminal 96 to be driven higher by an amount proportional to the difference in charge states of the gates 32 and 34 of memory cell 12.

In other words, a comparison of the output signals on lines 24 and 26 will be the change in voltage on data lines 16 and 18, $V_{O16}$ and $V_{O18}$, respectively. Assuming the gain of the transistors 56, 58, 82 and 84 is large, the relationship between $V_{O16}$ and $V_{O16}$, the output voltage $V_O$, and the current on data lines 16 or 18 as described above can be expressed by the following mathematical expressions:

$$V_f = V_{O16} \text{ or } V_{O18} = I*t/C_b$$

Where $V_o = I*t/C_f$ is the change in voltage of the data line capacitance ($V_{O16}$ or $V_{O18}$), I is the current, t is the time the current has been flowing, and $C_b$ is the capacitance of the data lines 16 or 18. $C_f$ is the of capacitor 64 and/or 86. The magnitude of the output voltage $V_o$ is, therefore, the magnitude of the change of the voltage on the feedback capacitance, $C_f$. Since the amplifier is inverting the change in the output, voltage is negative.

For example, when accessed, the transistor 28 of memory cell 12 outputs a current I on data line 16 and transistor 30 outputs a current I ΔI on data line 18. ΔI is proportional to the change in threshold voltage $V_t$ of gate 34 versus gate 32. The magnitude of the output voltage $V_O$ on output lines 24 and 26 will be:

$$V_{O24} = I*t/C_f$$

$$V_{O26} 32 \ (I \ \Delta I)*t/C_f$$

Therefore, the difference $V_{out}$ between the output signals on lines 24 and 26 may be expressed by:

$$V_{out} = \Delta I*t/C_f$$

Assuming for the purposes of example that ΔI is approximately one microampere (1 μA), t is approximately one nanosecond, and $C_f$, the capacitance of capacitors 64 and 86, is approximately 3 fF. This results in $V_{out}$ of approximately ⅓ Volt, a level which is more than sufficient to discriminate between $V_{O16}$ and $V_{O18}$. Thus, the smaller change in charge stored on floating gates 32 and 34 of memory cell 14 is capable of being detected. This allows for a significant increase in the endurance of memory cell 12.

Figure 5:
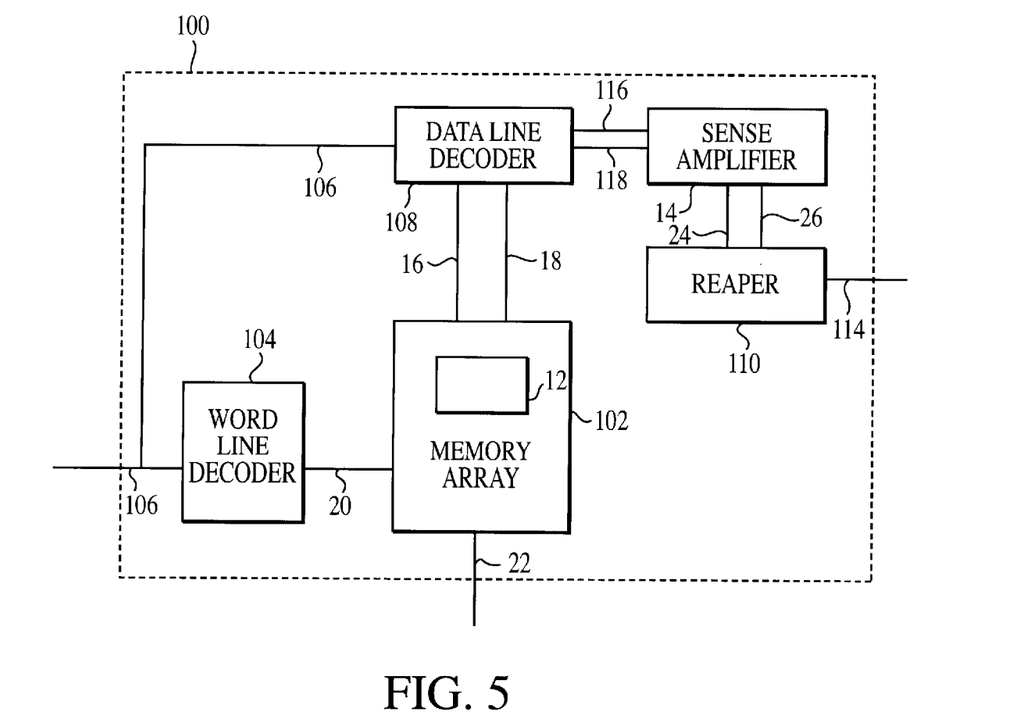
FIG. 5 is a block diagram of a memory module employing the preferred embodiment of the present invention.

The invention is particularly useful in an integrated memory circuit. In particular, the circuit device 10 is useful in memory devices requiring high endurance, for example in a disk drive or other storage devices which experience high usage. FIG. 5 shows a block diagram of an embodiment of a memory device, indicated generally at 100, that is constructed according to the teachings of the present invention. Memory device 100 includes at least one memory array 102 of flash memory cells. Memory array 102 stores data using at least one and preferably a number of flash memory cells 12 of the type shown and described above with respect to FIGS. 1, 2 and 4. The memory cells 12 may be accessed according to address signals provided by an external system (not shown) on address line 106. Address line 106 is coupled to word line decoder 104 and data line decoder 108. Word line decoder 104 and data line decoder 108 are coupled to memory array 100. A DCDS sense amplifier 14 is coupled to data line decoder 108 through data lines 116 and 118, respectively. Read circuit 110 is coupled to DCDS sense amplifier 14. Read circuit 110 provides the output of flash memory device 100 on line 114 by comparing the two output signals received from DCDS sense amplifier 14 on output lines 24 and 26. Read circuit 110 may be, for example, a comparator element.

In operation, flash memory device 100 writes, reads, and erases charge stored in each memory cell 12 of memory array 102. In write mode, flash memory device 100 receives an address on address line 106. Word line decoder 104 decodes the associated word line for a selected cell 12 and activates the word line 20. Data line decoder 108 similarly decodes the data lines 16 and 18 for the desired cell 12. The selected cell 12 in memory array 102 is then programmed to a selected state to store a value as described above with reference to FIG. 2.

In read mode, the address of the selected cell 12 is similarly decoded and accessed. Data line decoder 108 couples the selected cell 12 to DCDS sense amplifier 14. Read circuit 110 compares the voltage on line 24 to the voltage on line 26. The comparison results in an output signal that represents the value of memory cell 12. By using DCDS sense amplifier 14 the invention is capable of distinguishing the low drain current resulting from a very small variation in the charge held between the two floating gates 32 and 34 of each memory cell 12.

Figure 6:
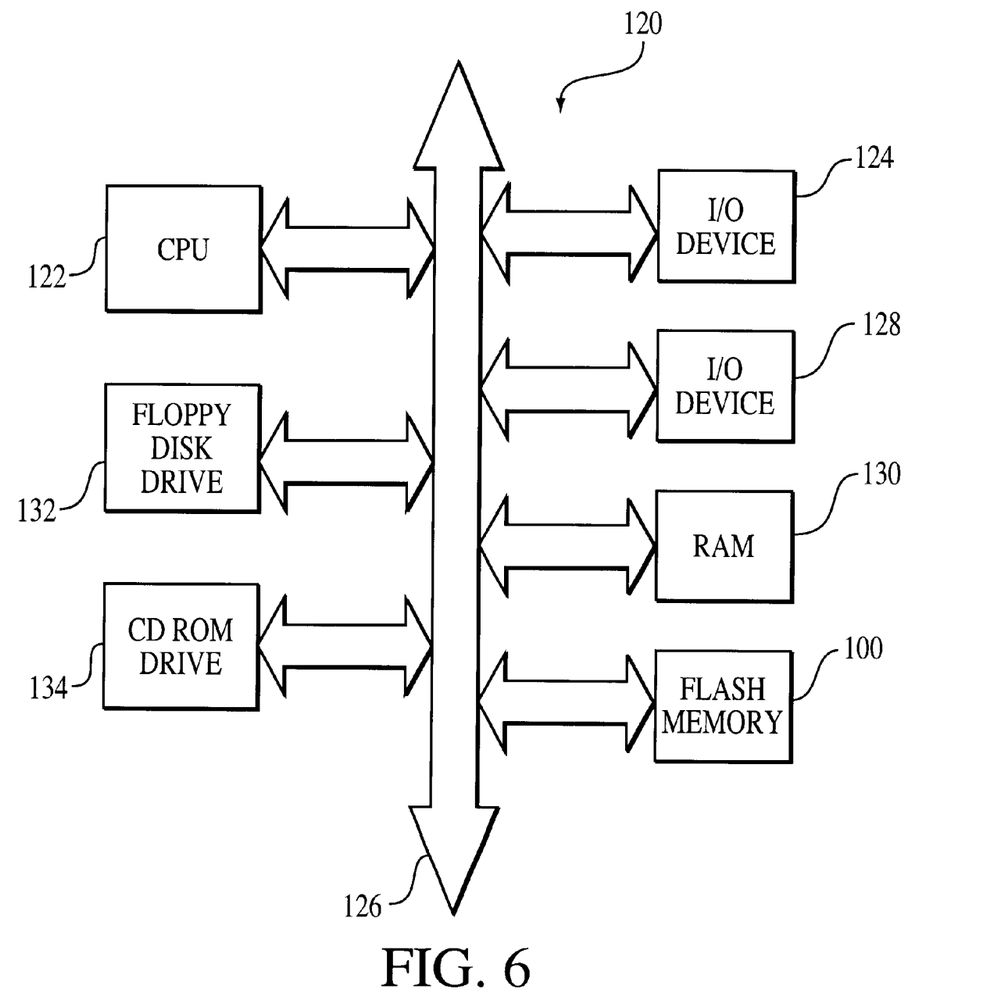
FIG. 6 is a block diagram of a processor based system using the memory module of FIG. 5.

Memory device 100 may form part of a general purpose processing system as shown in FIG. 6. FIG. 6 shows a block diagram of a processor-based system 120 utilizing a flash memory device 100 constructed in accordance with one of the embodiments of the present invention. The processor-based system 120 may be a computer system, a process control system or any other system employing a processor and associated memory.

A processor-based system 120 generally comprises a central processing unit (CPU) 122 that communicates with an input/output (I/O) device 124 over a bus 126. A second I/O device 128 is illustrated, but may not be necessary depending upon the system requirements. The system 120 also includes random access memory (RAM) 130, flash memory device 100 constructed according to the invention, and may include peripheral devices such as a floppy disk drive 132 and a compact disk (CD) ROM drive 134 which also communicate with CPU 122 over the bus 126. Flash memory device 100 is an integrated circuit which includes a flash memory cell 12 and a DCDS sense amplifier 14, as previously described with respect to FIGS. 1, 2, and 3.

Utilizing the method of the present invention, the cells 12 of flash memory device 100 can be accurately read to determine their logic state. It must be noted that the exact architecture of the processor-based system 120 is not important and that any combination of computer compatible devices may be incorporated into the system.

Similarly, although the invention has been described with reference to replacing disk drive storage devices, the invention has broader applicability and may be used in many integrated circuit applications. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. An integrated circuit comprising:
   at least one flash memory cell having at least first and second transistors, said first and second transistors connected to respective first and second data lines; and
   at least one differential correlated double sampling sense amplifier circuit for sensing a logic state of said memory cell, said sense amplifier connected to said first and second data lines.

2. The circuit of claim 1, wherein said flash memory cell has at least a first and second state, and wherein said first state exists when said first transistor and said second transistor hold equivalent charge states and said second state exists when one of said first and second transistors holds a charge greater than the other of said first and second transistors by an amount of charge less than about $1.5 \times 10^{-8}$ coulombs/cm$^2$.

3. The circuit of claim 2, wherein said first state is represents a binary zero.

4. The circuit of claim 2, wherein said second state is represents a binary one.

5. The circuit of claim 2, wherein said second state is represents a binary zero.

6. The circuit of claim 2, wherein said first state is represents a binary one.

7. The circuit of claim 1, wherein said at least one differential correlated double sampling sense amplifier comprises:
- at least a first amplifier circuit having capacitive feedback, said first amplifier circuit connected to said first data line of said memory cell; and
- at least a second amplifier circuit having capacitive feedback connected to said second data line of said memory cell.

8. The circuit of claim 1, wherein said at least one memory cell further comprises:
- a first transistor having a first control gate connected to a word line, a first source, a first drain connected to said first data line, and a first floating gate; and
- a second transistor having a second control gate connected to said word line, a second source, a second drain connected to said second data line, and a second floating gate; and
- wherein said at least one flash memory cell has at least a first and second state, and wherein said first state exists when said first floating gate and said second floating gate hold equivalent charge states and said second state exists when one of said first and second floating gates holds a charge greater than the other of said first and second floating gates.

9. The circuit of claim 8, wherein one of said first and second floating gates holds a charge greater than the other of said first and second floating gates by an amount of charge less than about $1.5 \times 10^{-8}$ coulombs/cm$^2$.

10. The circuit of claim 7, wherein said first and second amplifier circuits each comprise:
- an output terminal;
- an input terminal connected to said first or second data line;
- an integrator element having first and second connections, said first connection connected to said output terminal and said second connection connected to said input terminal;
- at least a first voltage source for supply of voltage to said output; said first voltage source gated by a signal received from said first connection of said integrator element;
- at least a second voltage source for supply of voltage to said output; said second voltage source gated by a signal received from said first connection of said integrator element;
- a reset circuit connected to said input terminal and said output terminal for resetting said output terminal to a predetermined voltage upon receipt of a reset signal.

11. The circuit of claim 10, further comprising a read circuit for receiving output signals from said outputs of said first and second amplifier circuits and comparing said output signals to determine the logic state of said memory cell.

12. The circuit of claim 11, wherein said read circuit comprises a comparator element having first and second inputs, said first input connected to said output of said first amplifier circuit and said second input connected to said output of said second amplifier circuit.

13. The circuit of claim 8, wherein said first and second floating gate comprise a plurality of conductive crystals isolated from said control gates and said sources and drains by an insulative material.

14. The circuit of claim 13, wherein said conductive crystals include silicon nano-crystals.

15. The circuit of claim 13, wherein said insulative material is an oxide.

16. The circuit of claim 10, wherein said first voltage source is gated by a P-channel transistor responsive to the signal on said first data line.

17. The circuit of claim 10, wherein said second voltage source is gated by an N-channel transistor responsive to the signal on said first data line.

18. The circuit of claim 10, wherein said first voltage source is gated by an N-channel transistor responsive to the signal on said first data line.

19. The circuit of claim 10, wherein said second voltage source is gated by a P-channel transistor responsive to the signal on said first data line.

20. The circuit of claim 10, wherein said integrator element is a capacitor.

21. The circuit of claim 10, wherein each of said first and second amplifier circuits further include a ground capacitor.

22. The circuit of claim 21, wherein said ground capacitor comprises a capacitor between said input terminal and an electrical ground.

23. The circuit of claim 10, wherein said output terminal of said first amplifier circuit and said output terminal of said second amplifier circuit are connected by an equalization transistor gated by a reset signal.

24. An integrated circuit comprising:
- at least one memory cell having at least first and second transistors connected to respective first and second data lines, said memory cell capable of being electrically programmed; and
- at least one sense amplifier circuit for sensing a logic state of said memory cell, said at least one sense amplifier comprising:
  - at least a first amplifier circuit having capacitive feedback, said first amplifier circuit connected to said first data line of said memory cell; and
  - at least a second amplifier circuit having capacitive feedback connected to said second data line of said memory cell.

25. The circuit of claim 24, wherein said at least one memory cell further comprises:
- a first transistor having a first control gate connected to a word line, a first source, a first drain connected to said first data line, and a first floating gate; and
- a second transistor having a second control gate connected to said word line, a second source, a second drain connected to said second data line, and a second floating gate; and
- wherein said at least one flash memory cell has at least a first and second state, and wherein said first state exists when said first floating gate and said second floating gate hold equivalent charge states and said second state exists when one of said first and second floating gates holds a charge greater than the other of said first and second floating gates.

26. The circuit of claim 25, wherein one of said first and second floating gates holds a charge greater than the other of said first and second floating gates by an amount of charge less than about $1.5 \times 10^{-8}$ coulombs/cm$^2$.

27. The circuit of claim 25, wherein said first state is represents a binary zero.

28. The circuit of claim 25, wherein said second state is represents a binary one.

29. The circuit of claim 25, wherein said second state is represents a binary zero.

30. The circuit of claim 25, wherein said first state is represents a binary one.

31. The circuit of claim 24, wherein said first and second amplifier circuits each comprise:
   an output terminal;
   an input terminal connected to said first or second data line;
   an integrator element having first and second connections, said first connection connected to said output terminal and said second connection connected to said input terminal;
   at least a first voltage source for supply of a first voltage to said output; said first voltage source gated by a signal received from said first connection of said integrator element;
   at least a second voltage source for supply of second voltage to said output; said second voltage source gated by a signal received from said first connection of said integrator element;
   a reset circuit connected to said input terminal and said output terminal for resetting said output terminal to a predetermined voltage upon receipt of a reset signal.

32. The circuit of claim 24, further comprising a read circuit for receiving signals from said outputs of said first and second amplifier circuits and comparing said outputs to determine the logic state of said memory cell.

33. The circuit of claim 32, wherein said read circuit comprises a comparator element having first and second inputs, said first input connected to said output of said first amplifier circuit and said second input connected to said output of said second amplifier circuit.

34. The circuit of claim 26, wherein said first and second floating gate comprise a plurality of conductive crystals isolated from said control gates and said sources and drains by an insulative material.

35. The circuit of claim 34, wherein said conductive crystals include silicon nano-crystals.

36. The circuit of claim 34, wherein said insulative material is an oxide.

37. The circuit of claim 31, wherein said first voltage source is gated by a P-channel transistor responsive to the signal on said first data line.

38. The circuit of claim 31, wherein said second voltage source is gated by an N-channel transistor responsive to the signal on said first data line.

39. The circuit of claim 31, wherein said first voltage source is gated by an N-channel transistor responsive to the signal on said first data line.

40. The circuit of claim 31, wherein said second voltage source is gated by a P-channel transistor responsive to the signal on said first data line.

41. The circuit of claim 31, wherein said integrator element is a capacitor.

42. The circuit of claim 31, wherein each of said first and second amplifier circuits further include a ground capacitor.

43. The circuit of claim 42, wherein said ground capacitor comprises a capacitor connected between said input terminal and an electrical ground.

44. The circuit of claim 31, wherein said output terminal of said first amplifier circuit and said output terminal of said second amplifier circuit are connected by an equalization transistor gated by a reset signal.

45. An integrated circuit comprising:
   at least one flash memory cell having at least first and second transistors connected to respective first and second data lines, said flash memory cell capable of being electrically programmed, and said memory cell comprising:
      a first transistor having a first control gate connected to a word line, a first source, a first drain connected to said first data line, and a first floating gate;
      a second transistor having a second control gate connected to said word line, a second source, a second drain connected to said second data line, and a second floating gate; and
      wherein said at least one flash memory cell has at least a first and second state, and wherein n said first state exists when said first floating gate and said second floating gate hold equivalent charge states and said second state exists when one of said first and second floating gates holds a charge greater than the other of said first and second floating gates by an amount of charge less than about $1.5 \times 10^{-8}$ coulombs/cm$^2$.
   at least one sense amplifier circuit for sensing a logic state of said memory cell, said at least one sense amplifier comprising:
      at least a first amplifier circuit having capacitative feedback, said first amplifier circuit connected to said first data line of said memory cell; and
      at least a second amplifier circuit having capacitative feedback connected to said second data line of said memory cell.

46. The circuit of claim 45, wherein said first state is represents a binary zero.

47. The circuit of claim 45, wherein said second state is represents a binary one.

48. The circuit of claim 45, wherein said second state is represents a binary zero.

49. The circuit of claim 45, wherein said first state is represents a binary one.

50. The circuit of claim 45, wherein said first and second amplifier circuits each comprise:
   an output terminal;
   an input terminal connected to said first or second data line;
   an integrator element having first and second connections, said first connection connected to said output terminal and said second connection connected to said input terminal;
   at least a first voltage source for supply of a first voltage to said output; said first voltage source gated by a signal received from said first connection of said integrator element;
   at least a second voltage source for supply of second voltage to said output; said second voltage source gated by a signal received from said first connection of said integrator element;
   a reset circuit connected to said input terminal and said output terminal for resetting said output terminal to a predetermined voltage upon receipt of a reset signal.

51. The circuit of claim 45, further comprising a read circuit for receiving signals from said outputs of said first and second amplifier circuits and comparing said outputs to determine the logic state of said memory cell.

52. The circuit of claim 51, wherein said read circuit comprises a comparator element having first and second inputs, said first input connected to said output of said first amplifier circuit and said second input connected to said output of said second amplifier circuit.

53. The circuit of claim 45, wherein said first and second floating gate comprise a plurality of conductive crystals isolated from said control gates and said sources and drains by an insulative material.

54. The circuit of claim 53, wherein said conductive crystals include silicon nano-crystals.

55. The circuit of claim 53, wherein said insulative material is an oxide.

56. The circuit of claim 50, wherein said first voltage source is gated by a P-channel transistor responsive to the signal on said first data line.

57. The circuit of claim 50, wherein said second voltage source is gated by an N-channel transistor responsive to the signal on said first data line.

58. The circuit of claim 50, wherein said first voltage source is gated by an N-channel transistor responsive to the signal on said first data line.

59. The circuit of claim 50, wherein said second voltage source is gated by a P-channel transistor responsive to the signal on said first data line.

60. The circuit of claim 50, wherein said integrator element is a capacitor.

61. The circuit of claim 50, wherein each of said first and second amplifier circuits further include a ground capacitor.

62. The circuit of claim 61, wherein said ground capacitor comprises a capacitor connected between said input terminal and an electrical ground.

63. The circuit of claim 50, wherein said output terminal of said first amplifier circuit and said output terminal of said second amplifier circuit are connected by an equalization transistor gated by a reset signal.

64. An integrated circuit comprising:
   at least one word line for receiving an address signal;
   at least first and second data lines for transmitting first and second data signals;
   at least one memory cell, said memory cell comprising:
      a first MOSFET transistor having a first control gate connected to said word line, a first source, a first drain connected to said first data line, and a first floating gate; and
      a second MOSFET transistor having a second control gate connected to said word line, a second source, a second drain connected to said second data line, and a second floating gate; and
   a sense amplifier circuit, said sense amplifier circuit comprising:
      a first and second input terminal for receiving said first and second data signals;
      first and second output terminals for transmitting the output of said sense amplifier circuit;
      a first N-channel transistor coupled in series to a first P-channel transistor, a gate of said first N-channel transistor coupled to said first input terminal, and a gate of said first P-channel transistor coupled to said first input terminal;
      a first capacitor coupled to said first input terminal and said first output terminal in parallel to said first N-channel transistor and said first P-channel transistor;
      a first reset transistor coupled to said first input terminal and said first output terminal in parallel to said first N-channel transistor and said first P-channel transistor, said first reset transistor gated by a reset signal;
      a second N-channel transistor coupled in series to a second P-channel transistor, a gate of said second N-channel transistor coupled to said second input terminal, and a gate of said second P-channel transistor coupled to said second input terminal;
      a second capacitor coupled to said second input terminal and said second output terminal in parallel to said second N-channel transistor and said second P-channel transistor;
      a second reset transistor coupled to said second input terminal and said second output terminal in parallel to said second N-channel transistor and said second P-channel transistor, said second reset transistor gated by a reset signal;
      a first voltage supply connected to said first and second N-channel transistors; and
      a second voltage supply connected to said first and second P-channel transistors.

65. The circuit of claim 64, wherein said at least one memory cell has at least a first and second state, and wherein said first state exists when said first floating gate and said second floating gate hold equivalent charge states and said second state exists when one of said first and second floating gates holds a charge greater than the other of said first and second floating gates by an amount of charge less than about $1.5 \times 10^{-8}$ coulombs/cm$^2$.

66. The circuit of claim 64, further comprising a third reset transistor connected between said first and second output terminals, said third reset transistor gated by a reset signal.

67. The circuit of claim 64, wherein said first voltage supply is the internal voltage of said integrated circuit.

68. The circuit of claim 64, wherein said second voltage supply is ground.

69. A flash memory device comprising:
   an array of memory cells, wherein each of said flash memory cells comprises at least first and second MOSFET transistors, said first and second MOSFET transistors connected to first and second data lines, respectively, and each of said first and second MOSFET transistors contain respective first and second floating gates;
   wherein each of flash memory cells has at least a first and second state, and wherein said first state exists when said first MOSFET transistor and said second MOSFET transistor hold equivalent charge states and said second state exists when one of said first and second MOSFET transistors holds a charge greater than the other of said first and second MOSFET transistors by an amount of charge less than about $1.5 \times 10^{-8}$ coulombs/cm$^2$; and
   at least one differential correlated double sampling sense amplifier circuit for sensing a logic state of said memory cell, said sense amplifier connected to said first and second data lines.

70. The flash memory device of claim 69, further comprising a word line decoder connected to said array of memory cells.

71. The flash memory device of claim 69, further comprising a data line decoder connected to said array of memory cells and said differential correlated double sampling sense amplifier.

72. The flash memory device of claim 69, wherein said at least one differential correlated double sampling sense amplifier comprises:
   at least a first amplifier circuit having capacitative feedback, said first amplifier circuit connected to said first data line of said memory cell; and
   at least a second amplifier circuit having capacitative feedback connected to said second data line of said memory cell.

73. The flash memory device of claim 72, wherein said first and second amplifier circuits each comprise:

an output terminal;

an input terminal connected to said first or second data line;

an integrator element having first and second connections, said first connection connected to said output terminal and said second connection connected to said input terminal;

at least a first voltage source for supply of voltage to said output; said first voltage source gated by a signal received from said first connection of said integrator element;

at least a second voltage source for supply of voltage to said output; said second voltage source gated by a signal received from said first connection of said integrator element;

a reset circuit connected to said input terminal and said output terminal for resetting said output terminal to a predetermined voltage upon receipt of a reset signal.

74. The flash memory device of claim 73, further comprising a read circuit for receiving output signals from said outputs of said first and second amplifier circuits and comparing said output signals to determine the logic state of said memory cell.

75. The flash memory device of claim 74, wherein said read circuit comprises a comparator element having first and second inputs, said first input connected to said output of said first amplifier circuit and said second input connected to said output of said second amplifier circuit.

76. The flash memory device of claim 69, wherein each of said first and second floating gates comprise a plurality of conductive crystals isolated from said control gates and said sources and drains by an insulative material.

77. The flash memory device of claim 76, wherein said conductive crystals include silicon nano-crystals.

78. The flash memory device of claim 77, wherein said insulative material is an oxide.

79. The flash memory device of claim 74, wherein said first voltage source is gated by a P-channel transistor responsive to the signal on said first data line.

80. The flash memory device of claim 74, wherein said second voltage source is gated by an N-channel transistor responsive to the signal on said first data line.

81. The flash memory device of claim 74, wherein said first voltage source is gated by an N-channel transistor responsive to the signal on said first data line.

82. The flash memory device of claim 74, wherein said second voltage source is gated by a P-channel transistor responsive to the signal on said first data line.

83. The flash memory device of claim 74, wherein said integrator element is a capacitor.

84. The flash memory device of claim 73, wherein each of said first and second amplifier circuits further comprise a ground capacitor.

85. The flash memory device of claim 84, wherein said ground capacitor comprises a capacitor between said first terminal and an electrical ground.

86. The flash memory device of claim 73, wherein said output terminal of said first amplifier circuit and said output terminal of said second amplifier circuit are connected by an equalization transistor gated by a reset signal.

87. A computer system comprising:

a processor;

a memory circuit connected to said processor, said memory circuit comprising:

an array of memory cells, wherein each of said memory cells has at least first and second transistors, each of said first and second transistors having a floating gate, said first and second transistors connected to respective first and second data lines; and at least one differential correlated double sampling sense amplifier circuit for sensing a logic state of said memory cell, said sense amplifier connected to said first and second data lines.

88. The computer system of claim 87, wherein said memory circuit is a flash memory.

89. The computer system of claim 87, wherein said flash memory cell has at least a first and second state, and wherein said first state exists when said first transistor and said second transistor hold equivalent charge states and said second state exists when one of said first and second transistors holds a charge greater than the other of said first and second transistors by an amount of charge less than about $1.5 \times 10^{-8}$ coulombs/cm$^2$.

90. The computer system of claim 89, wherein said at least one differential correlated double sampling sense amplifier comprises:

at least a first amplifier circuit having capacitative feedback, said first amplifier circuit connected to said first data line of said memory cell; and at least a second amplifier circuit having capacitative feedback connected to said second data line of said memory cell.

91. The computer system of claim 89, wherein said at least one memory cell further comprises:

a first transistor having a first control gate connected to a word line, a first source, a first drain connected to said first data line, and a first floating gate; and a second transistor having a second control gate connected to said word line, a second source, a second drain connected to said second data line, and a second floating gate; and wherein said at least one flash memory cell has at least a first and second state, and wherein said first state exists when said first floating gate and said second floating gate hold equivalent charge states and said second state exists when one of said first and second floating gates holds a charge greater than the other of said first and second floating gates.

92. The computer system of claim 91, wherein one of said first and second floating gates holds a charge greater than the other of said first and second floating gates by an amount of charge less than about $1.75 \times 10^{-8}$ coulombs/cm$^2$.

93. The computer system of claim 90, wherein said first and second amplifier circuits each comprise:

an output terminal;

an input terminal connected to said first or second data line;

an integrator element having first and second connections, said first connection connected to said output terminal and said second connection connected to said input terminal;

at least a first voltage source for supply of voltage to said output; said first voltage source gated by a signal received from said first connection of said integrator element;

at least a second voltage source for supply of voltage to said output; said second voltage source gated by a signal received from said first connection of said integrator element;

a reset circuit connected to said input terminal and said output terminal for resetting said output terminal to a predetermined voltage upon receipt of a reset signal.

94. The computer system of claim 93, further comprising a read circuit for receiving output signals from said outputs of said first and second amplifier circuits and comparing said output signals to determine the logic state of said memory cell.

95. The computer system of claim 94, wherein said read circuit comprises a comparator element having first and second inputs, said first input connected to said output of said first amplifier circuit and said second input connected to said output of said second amplifier circuit.

96. The computer system of claim 87, wherein said first and second floating gate comprise a plurality of conductive crystals isolated from said control gates and said sources and drains by an insulative material.

97. The computer system of claim 96, wherein said conductive crystals include silicon nano-crystals.

98. The computer system of claim 96, wherein said insulative material is an oxide.

99. The computer system of claim 93, wherein said first voltage source is gated by a P-channel transistor responsive to the signal on said first data line.

100. The computer system of claim 93, wherein said second voltage source is gated by an N-channel transistor responsive to the signal on said first data line.

101. The computer system of claim 93, wherein said first voltage source is gated by an N-channel transistor responsive to the signal on said first data line.

102. The computer system of claim 93, wherein said second voltage source is gated by a P-channel transistor responsive to the signal on said first data line.

103. The computer system of claim 93, wherein said integrator element is a capacitor.

104. The computer system of claim 93, wherein each of said first and second amplifier circuits further include a ground capacitor.

105. The computer system of claim 104, wherein said ground capacitor comprises a capacitor between said input terminal and an electrical ground.

106. The computer system of claim 90, wherein said output terminal of said first amplifier circuit and said output terminal of said second amplifier circuit are connected by an equalization transistor gated by a reset signal.

107. A computer system comprising:
a processor;
a memory circuit connected to said processor, said memory circuit comprising:
an array of memory cells, wherein each of said memory cells comprises at least first and transistors having first and second floating gates, said first and second transistors connected to first and second data lines, respectively;
wherein each of said memory cells has at least a first and second state, said first state exists when said first transistor and said second transistor hold equivalent charge states and said second state exists when one of said first and second transistors holds a charge greater than the other of said first and second transistors by an amount of charge less than about $1.5 \times 10^{-8}$ coulombs/cm$^2$; and
at least one differential correlated double sampling sense amplifier circuit for sensing a logic state of said memory cell, said sense amplifier connected to said first and second data lines.

108. The computer system of claim 107, wherein said memory circuit is a flash memory.

109. A method of extending the endurance of a flash memory circuit, said method comprising the steps of:

programming a flash memory cell using a charge of less than about $1.5 \times 10^{-8}$ coulombs/cm$^2$;
accessing said memory cell, said memory cell conducting in accordance with a level of charge stored in said memory cell;
producing at least one current corresponding to the level of charge stored in said memory cell; and
integrating said at least one current to a voltage signal proportional to said at least one current.

110. The method according to claim 109, wherein said step of programming is accomplished by programming a differential flash memory cell, said differential memory cell having first and second transistors.

111. The method according to claim 110, wherein said step of producing a current includes the step of producing a first and second current corresponding to respective of said first and second transistors.

112. The method according to claim 110, wherein said step of programming includes the step of programming either a first and second state, said first state existing when said first transistor and said second transistor hold equivalent charge states and said second state exists when one of said first and second transistors holds a charge greater than the other of said first and second transistors by an amount of charge less than about $1.5 \times 10^{-8}$ coulombs/cm$^2$.

113. The method according to claim 111, further comprising the step of producing first and second output signals.

114. The method according to claim 113, further comprising the step of comparing said first and second output signals.

115. The method according to claim 111, wherein said step of integrating said first current further comprises:
gating a first voltage using said first current;
gating a second voltage using said second current; and
passing said first voltage and said first current through a first integrating component.

116. The method according to claim 111, wherein said step of integrating said second current further comprises:
gating a first voltage using said second current;
gating a second voltage using said second current; and
passing said first voltage and said second current through a second integrating component.

117. The method according to claim 109, further comprising the step of resetting a sense amplifier to a base voltage level.

118. The method according to claim 109, wherein said integrating component is a capacitor.

119. A method of storing and sensing data, said method comprising the steps of:
programming a memory cell having at least first and second transistors to have at least a first and second state, said first state existing when said first transistor and said second transistor hold equivalent charge states and said second state existing when one of said first and second transistors holds a charge greater than the other of said first and second transistors by an amount of charge less than about $1.5 \times 10^{-8}$ coulombs/cm$^2$;
accessing said memory cell, said memory cell conducting in accordance with a level of charge stored in each of said first and second floating gates;
producing a first and second current corresponding to the level of charge stored in each of said first and second floating gates;
resetting a sense amplifier to a base voltage level;
reading a first output signal from said sense amplifier;

integrating each of said first and second currents within said sense amplifier to produce a first and second voltage signals proportional to said first and second currents;

outputting a second output signal responsive to said first and second voltage signal representing the charge level of said accessed memory cell; and reading said output signal.

120. The method according to claim 119, further comprising the step of comparing said first and second output signals.

121. The method according to claim 120, wherein said step of comparing said first and second output signals is performed using a differential method.

122. The method according to claim 119, wherein said step of integrating said first current further comprises:

gating a first voltage using said first current;

gating a second voltage using said second current; and passing said first voltage and said first current through a first integrating component.

123. The method according to claim 119, wherein said step of integrating said second current further comprises:

gating a first voltage using said second current;

gating a second voltage using said second current; and passing said first voltage and said second current through a second integrating component.

124. The method according to claim 119, wherein said step of resetting further comprises short-circuiting said first and second capacitors.

125. The method according to claim 119, wherein said integrating component is a capacitor.

* * * * *

UNITED STATES PATENT AND TRADEMARK OFFICE
CERTIFICATE OF CORRECTION

PATENT NO. : 6,337,808 B1
DATED : January 8, 2002
INVENTOR(S) : Leonard Forbes

It is certified that error appears in the above-identified patent and that said Letters Patent is hereby corrected as shown below:

Column 2,
Line 18, the word "On" should be changed to -- One --;

Column 5,
Line 55, the word "reduces" should be changed to -- reduce --;

Column 6,
Line 65, the symbol "$V_{O16}$" should be changed to -- $V_{O18}$ --;

Column 7,
Line 5, the words "the of" should be changed to -- the capacitance of --.

Signed and Sealed this

Twenty-fifth Day of June, 2002

*Attest:*

JAMES E. ROGAN
*Director of the United States Patent and Trademark Office*

*Attesting Officer*